United States Patent [19]
Kaminsky

[11] 3,980,916
[45] Sept. 14, 1976

[54] BEAM LIMITER FOR THERMONUCLEAR FUSION DEVICES

[75] Inventor: Manfred S. Kaminsky, Hinsdale, Ill.

[73] Assignee: The United States of America as represented by the United States Energy Research and Development Administration, Washington, D.C.

[22] Filed: July 22, 1975

[21] Appl. No.: 598,101

[52] U.S. Cl............................. 313/231.3; 313/361
[51] Int. Cl.².......................................... H01J 17/26
[58] Field of Search................. 313/231.3, 359, 360, 313/361, 362, 363, 448, 423, 389, 231, 231.1, 231.2; 335/210

[56] References Cited
UNITED STATES PATENTS

| | | | |
|---|---|---|---|
| 2,185,133 | 12/1939 | Schlesinger | 313/448 |
| 3,393,385 | 7/1968 | Danby et al. | 335/210 |
| 3,631,283 | 12/1971 | Gautherin et al. | 313/362 |

OTHER PUBLICATIONS

Plasma–Wall Interactions in The TFR Machine P. H. Rebut, et al. Journal of Nuclear Materials 1974 pp. 1–9.

*Primary Examiner*—R. V. Rolinec
*Assistant Examiner*—Vincent J. Sunderdick
*Attorney, Agent, or Firm*—Dean E. Carlson; Arthur A. Churm; Hugh W. Glenn

[57] ABSTRACT

A beam limiter circumscribes the interior surface of a vacuum vessel to inhibit collisions of contained plasma and the vessel walls. The cross section of the material making up the limiter has a flatsided or slightly concave portion of increased width towards the plasma and portions of decreased width towards the interior surface of the vessel. This configuration is designed to prevent a major fraction of the material sputtered, vaporized and blistered from the limiter from reaching the plasma. It also allows adequate heat transfer from the wider to the narrower portions. The preferred materials for the beam limiter are solids of sintered, particulate materials of low atomic number with low vapor pressure and low sputtering and blistering yields.

7 Claims, 3 Drawing Figures

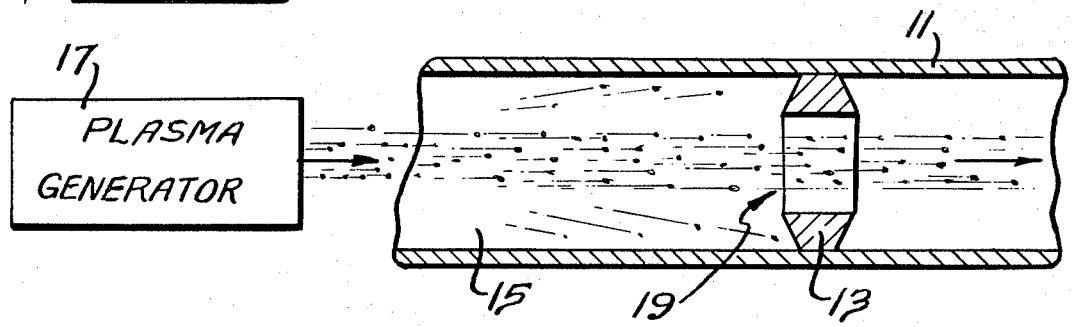
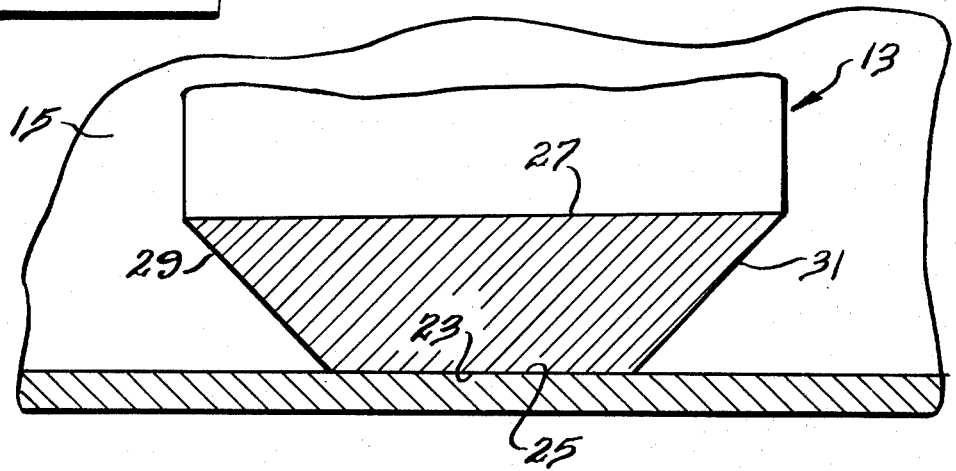
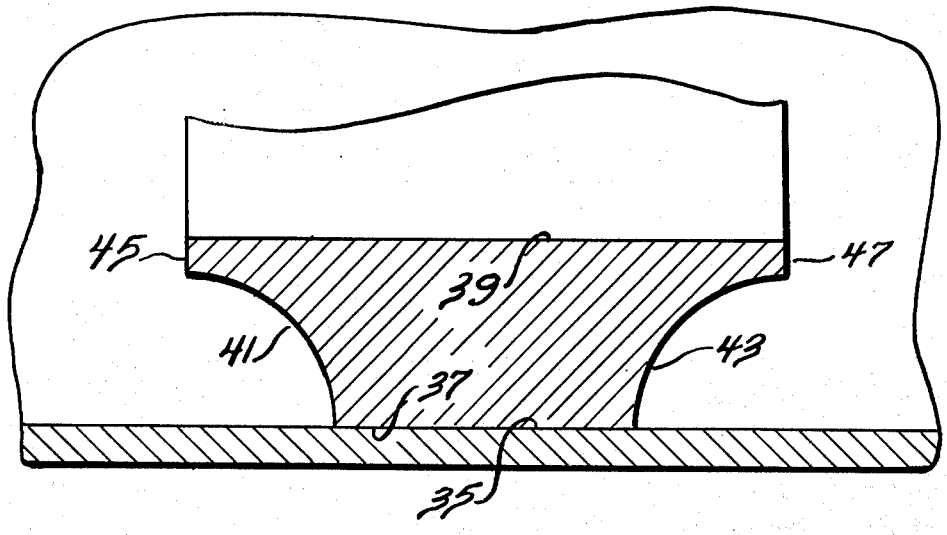

REAM LIMITER FOR THERMONUCLEAR FUSION DEVICES

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

The present invention relates to plasma containment devices and to plasma confinement systems such as those employed in thermonuclear fusion studies. It is applicable to both toroidal confinement systems, such as tokamaks, levitrons or stellarators and linear confinement systems as employed in linear theta pinch and linear machines. The invention relates in particular to beam limiter devices comprising ringshaped or helical structural members. The individual rings and individual turns of a helical beam limiter may be of circular, elliptical, D-shaped and other closed or nearly closed configurations.

Although some plasma systems employ strong magnetic fields, for plasma confinement, solid rings as beam limiters may be positioned at intervals along the internal surface of the vacuum vessel or liner containint the plasma. The beam limiter ring can thereby shade a portion of the internal surface from plasma particle impact and the resulting erosion.

The beam limiter rings employed heretofore have suffered from a number of shortcomings. Plasma particles colliding with the beam limiter have severely disintegrated portions of the ring facing the plasma. The collision of plasma particles on the limiter causes vaporization, sputtering and blistering with accompanying release of beam limiter materials. This released material on entering the plasma produces serious power losses due to bremsstrahlung and line radiation that can lead to an abrupt end to the plasma discharge. Some of these problems have been discussed and illustrated in "Plasma Wall Interactions in the T.F.R. Machine" by Rebut et al., Journal of Nuclear Materials, Vol. 53, page 16, Aug. 1974.

Previously employed beam limiters have comprised rings having rectangular and convex-curved cross sections taken on a plane cutting the ring at two diametrically opposed locations. Both of these cross-sectional configurations have permitted sputtered, blistered or vaporized limiter materials to readily enter the plasma region. Rings having convex cross sections with apexes towards the plasma suffer from the additional disadvantage of decreased material in the portion of the ring nearest the plasma.

SUMMARY OF THE INVENTION

Therefore, in view of these problems discussed above, it is an object of the present invention to provide an improved beam limiter device for use in fusion confinement systems to inhibit collisions between the plasma particles and the confinement walls of the system.

It is also an object to provide a beam limiter design that minimizes plasma contamination by sputtered, blistered and vaporized material.

It is a further object to provide a beam limiter design to compensate for plasma particle erosion.

In accordance with the present invention, a beam limiter is provided for inhibiting collision between plasma particles and the interior surface of a hollow body containing that plasma. The limiter comprises a solid member disposed about the interior surface of the body to form an opening through which the plasma can pass. The solid member has a proximal surface in intimate engagement with the interior surface of the body and a distal surface opposite to the proximal surface but of increased width. The side surfaces connect the distal and proximal surfaces to outline a cross section of increasing width over a major portion of the thickness from the proximal to the distal surface.

DESCRIPTION OF THE DRAWINGS

The present invention is illustrated in the accompanying drawings wherein:

FIG. 1 is a simplified fragmentary view of a plasma containment device including a beam limiter in cross section.

FIG. 2 is an enlarged fragmentary cross section of the beam limiter shown in FIG. 1.

FIG. 3 shows an alternate cross section of a beam limiter.

DETAILED DESCRIPTION OF THE PREFERRED EMBODIMENT

In FIG. 1, a hollow body 11 for containing a plasma is illustrated with a beam limiter 13 disposed around its inner circumference. The plasma containment body 11 is illustrated in simplified and fragmentary form as any hollow structure for containing a plasma of ionized gas. For purposes of the present invention the shape of body 11 is not critical. For instance, it may be tubular with various cross-sectional configurations. It contains a linear, toroidal or other shaped vacuum space 15 for containing an ionizable gas at subatmospheric pressure. For clarity in the drawing, FIG. 1 does not show various other components known to those skilled in the art for the containment of a plasma. For example, radiation shields, thermal shields, cooling channels and other components, depending on the specific application, will often be employed.

The beam limiter 13 is a solid member disposed about the inner surface of hollow body 11 to define an opening 19 through which ionized gas plasma passes. A typical plasma containment device can include a plurality of beam limiter rings disposed about the vacuum space 15. Alternatively, a continuous beam limiter of helical shape can be employed.

The plasma within vacuum space 15 can be generated by an electric discharge, or other like means illustrated diagrammatically as plasma generator 17. In confinement systems used for thermonuclear research, plasma generator 17, for instance, can comprise windings of electrically conductive material connected to an alternating source of electrical current to produce alternating magnetic fields within the vacuum space. Large, ionizing currents are thereby induced within the ionizable gas to generate the plasma.

An enlarged cross section of a beam limiter 13 is illustrated in FIG. 2. Beam limiter 13 includes an outer or proximal surface 23 in intimate engagement with the internal surface 25 of the plasma containment body. The cross sections of surfaces 23 and 25 are illustrated as flat or straight edges. Of course, where toroidal or other curved shaped containments are employed, these edges will be slightly curved. However, where the radius of curvature is large compared to the beam limiter cross section, surfaces 23 and 25 will project nearly flat edges. A typical example of such a case is shown in the reference cited in the Background of the Invention.

Opposite and generally parallel to proximal surface 23 is an inner, distal surface 27 facing the plasma region. Distal surface 27 projects a generally flat or straight edge in cross section so as to be parallel to the most prevalent direction of plasma particle travel. As an alternative, a slightly concave cross section at surface 27 can be employed. For purposes of this application the term "generally flat" is intended to include both flat and slightly concave cross-sectional edges but to exclude convex cross-sectional edges.

Side surfaces 29 and 31 interconnect proximal and distal surfaces 23 and 27 to define a cross section of progressively increasing width (the horizontal dimension between side surfaces 29 and 31 of FIG. 2) from proximal surface 23 to distal surface 27. However, in accordance with the invention it is sufficient for the width of the beam limiter to progressively increase over a major fraction of the thickness from the proximal to the distal surface (e.g. see FIG. 3). The width of surface 27 is sufficiently greater than the width of surface 23 for a given beam limiter thickness (the vertical dimension between surfaces 23 and 27) to provide an outwardly extending shape to side surfaces 29 and 31 over portions of internal surface 25. This configuration shades a portion of internal surface 25 from plasma particle bombardment and captures a fraction of the sputtered, blistered and vaporized material resulting from bombardment of the beam limiter ring.

Plasma particles striking side surfaces 29 or 31 can, by momentum transfer, sputter away portions of the beam limiter material. In addition, heating will occur to vaporize material and possibly rupture blistered portions by explosion of trapped gas bubbles. This released material, which otherwise would contaminate the plasma, is to a large extent captured on the overhanging side surfaces 29 and 31 and on the internal surface 25 beneath these overhanging side surfaces.

Although the width of surface 27 is sufficiently greater than the width of surface 23 to adequately shield the plasma from released material, it must not be so extreme as to prevent adequate heat transfer from the limiter to the containment body. Examples of the preferred ratios of dimensions to accomplish both of these purposes are a width of surface 27 equal to about twice the width of surface 23 and a thickness between surfaces 23 and 27 equal to about one-half the width of surface 23. With side surfaces 29 and 31, as shown, this provides an overhang of about one-half the width of proximal surface 23 beneath each side surface.

FIG. 3 illustrates an alternate cross section for a beam limiter ring. The ring includes a proximal surface 37 in intimate contact with the internal surface 35 of the plasma confinement body and a generally flat distal surface 39 facing the plasma. Curved, concave side surfaces 41 and 43 extend outwardly from proximal surface 37 while flat side surfaces 45 and 47 continue to distal surface 39. The curved side surfaces 41 and 43 extend over a major fraction, e.g. substantially more than half of the beam limiter thickness and serve to shield the plasma from contaminating material released as a result of particle bombardment of the ring. Flat side surfaces 45 and 47 leave sufficient area for heat transfer to cool the peripheral regions near distal surface 39.

Examples of the preferred dimensional ratios for the FIG. 3 embodiment are basically the same as for the FIG. 2 embodiment in order to permit good cooling of the beam limiter and to minimize contamination of the plasma. The thickness between surfaces 39 and 37 of the beam limiter ring is slightly increased to about two-thirds the width (between the proximal ends of surfaces 41 and 43) of surface 37. The width of surface 37 is approximately one-half the width (between surfaces 45 and 47) of surface 39. Also the thickness of surface 45 (and of 47) is preferably about one-fourth the total thickness between surfaces 37 and 39. The curved surfaces 41 and 43 preferably have a radius of curvature of about three-fourths the total thickness. The curvature is shown as the arc of a circle centered on surface 35 at the intersection of projected lines from surfaces 45 and 47 onto surface 35.

It will, of course, be clear that various other cross-sectional configurations can be employed for the beam limiter of the present invention. Side surfaces 41 and 43 can be of constant curvature as shown in FIG. 3 or of variable curvature. A plurality of stepped and shoulder surfaces can also be employed between the distal and proximal surfaces of the beam limiter. Of course, more complicated cross sections will introduce more difficulties in machining the limiters but may also offer improved shielding or heat transfer characteristics.

The beam limiters are preferably constructed of a low atomic weight material having low vapor pressure, for instance lower than about $10^{-9}$ Torr at 1200°K. Also the material should exhibit low blistering and sputtering yields respecting those of stainless steel or molybdenum and other refractory metals previously used for beam limiters. One especially suitable group are solid materials formed of sintered particulate metals, sintered metal oxides, and sintered carbon and silicon-containing materials. Examples of preferable materials are sintered particulate beryllium, beryllia, aluminum, and alumina.

The solid, sintered materials for the beam limiter are formed of finely powdered particles that are compacted and sintered to provide a suitable microstructure having small grain sizes, for example 0.5 micron or less. These small grain sizes prevent the build-up of gas bubbles of such as helium and thus result in a substantial improvement in resistance to blistering.

It will therefore be seen that the above-described invention provides an improved beam limiter configuration. The improved design provides increased material at those portions of the beam limiter ring that are close to the plasma core where most of the erosion is to be expected. The design also minimizes plasma particle collision with unshielded surfaces and provides for capture of sputtered, blistered and vaporized material to avoid contamination and increased resistivity of the plasma.

The embodiments of the invention in which an exclusive property or privilege is claimed are defined as follows:

1. In a beam limiter for inhibiting collision between a plasma and the interior surface of a hollow body containing said plasma wherein said beam limiter comprises a solid member disposed about the interior surface of said body in intimate engagement therewith to form an opening through which said plasma may pass, the improvement wherein said solid member having a proximal surface in intimate engagement with said interior surface of said body, a distal surface opposite to but of greater width than said proximal surface, and oppositely facing side surfaces interconnecting said distal and proximal surfaces, said proximal, distal and side surfaces defining a cross section of increasing width over a major portion of the thickness from said proximal to said distal surfaces.

2. The beam limiter of claim 1 wherein said distal surface projects a generally flat edge in said cross section.

3. The beam limiter of claim 1 wherein said side surfaces slope outwardly from said proximal surface and extend over a portion of said interior surface of said hollow body.

4. The beam limiter of claim 1 wherein said proximal surface is opposite to and generally parallel to said distal surface.

5. The beam limiter of claim 1 wherein said proximal surface is about one-half the width of said distal surface.

6. The beam limiter of claim 1 wherein the thickness between said proximal and distal surfaces is about one-half to two-thirds the width of said proximal surface.

7. The beam limiter of claim 1 wherein each of said side surfaces includes a concave curved portion adjacent to said proximal surface and a flat portion adjacent to said distal surface, said curved portion having a sufficient radius of curvature to extend over a major portion of the thickness of said beam limiter between said proximal and distal surfaces.

* * * * *